(12) United States Patent
Hata et al.

(10) Patent No.: US 8,431,952 B2
(45) Date of Patent: Apr. 30, 2013

(54) LIGHT EMITTING DEVICE

(75) Inventors: Toshio Hata, Osaka (JP); Takahiro Nemoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 93 days.

(21) Appl. No.: 13/216,548

(22) Filed: Aug. 24, 2011

(65) Prior Publication Data

US 2012/0049237 A1 Mar. 1, 2012

(30) Foreign Application Priority Data

Aug. 27, 2010 (JP) ................................ P2010-190435

(51) Int. Cl.
H01L 33/00 (2010.01)

(52) U.S. Cl.
USPC ..................................... 257/99; 257/E33.066

(58) Field of Classification Search .................... 257/99, 257/E33.066
See application file for complete search history.

(56) References Cited

U.S. PATENT DOCUMENTS

| 7,771,093 B2 | 8/2010 | Kishikawa et al. |
| 7,910,946 B2 | 3/2011 | Kamada |
| 2008/0048201 A1 | 2/2008 | Kim et al. |
| 2011/0031525 A1 | 2/2011 | Nemoto et al. |
| 2011/0084299 A1* | 4/2011 | Kotani et al. ............. 257/98 |
| 2011/0186901 A1* | 8/2011 | Ushiyama et al. ............. 257/99 |
| 2012/0044667 A1* | 2/2012 | Hanawa et al. ............. 362/97.1 |

FOREIGN PATENT DOCUMENTS

| JP | 2004-363537 | 12/2004 |
| JP | 2007-096108 | 4/2007 |
| JP | 2007-280983 | 10/2007 |
| JP | 2008-047712 | 2/2008 |
| JP | 2008-53726 | 3/2008 |
| JP | 2008-091864 | 4/2008 |
| JP | 2008-300386 | 12/2008 |
| JP | 2009-009956 | 1/2009 |
| WO | WO 2007/069399 | 6/2007 |

OTHER PUBLICATIONS

U.S. Appl. No. 12/851,195, filed Aug. 2010, Nemoto et al.

* cited by examiner

*Primary Examiner* — David S Blum
(74) *Attorney, Agent, or Firm* — Nixon & Vanderhye, P.C.

(57) ABSTRACT

In order to provide a light emitting device at low costs with high reliability, while suppressing deterioration in luminance of light emitting elements due to the existence of a protection element, the protection element is mounted on a mounting surface of a first lead terminal located inside a cavity in a resin section, and a light emitting element is mounted on a bottom of a recess section of a second lead terminal located in the cavity, so that the protection element is located above the light emitting device.

14 Claims, 8 Drawing Sheets

LIGHT EMITTING DEVICE

CROSS REFERENCES TO RELATED APPLICATIONS

This nonprovisional application claims priority under 35 U.S.C. §119(a) on Patent Application No. 2010-190435 filed in Japan on Aug. 27, 2010, the entire contents of which are hereby incorporated by reference.

TECHNICAL FIELD

The present invention relates to a light emitting device, and more particularly relates to a light emitting device having a protection element.

BACKGROUND ART

Light emitting devices with light emitting diode chip are generally formed by mounting light emitting diode chips on packages of various forms according to application purposes.

One of the light emitting devices having a protection element is disclosed in JP 2007-280983 A (Patent Literature 1). FIG. 14 is a perspective view showing the conventional light emitting device disclosed in Patent Literature 1.

In FIG. 14, a package 1 has an opening 3 for a light emitting element 2 and an opening 4 for a protection element in one side surface. The light emitting element 2 is mounted in a recess section 5 which forms the opening 3. The protection element (not shown) is mounted in a recess section 6 which forms the opening 4.

The opening 4 is formed independently of the opening 3 of the recess section 5 which has the light emitting element 2 mounted therein. In short, the package 1 functions as a wall enclosing the opening 4 to define a protection element mounting region. Such configuration allows reliable separation of the light emitting element 2 and the protection element, and therefore it becomes possible to prevent the protection element from being exposed to the light emitted from the light emitting element 2. As a result, deterioration in luminous efficiency can be suppressed and a high power light emitting device can be implemented.

Another light emitting device having a protection element is disclosed in WO 2007/069399 A (Patent Literature 2). FIG. 15 is a plan view of the conventional light emitting device disclosed in Patent Literature 2.

In FIG. 15, the light emitting device 11 has a light emitting diode 13 mounted on a heat radiating member 12, and has a protection element (Zener diode) 15 mounted on a metal tab 14 whose upper surface is lower than that of the heat radiating member 12. This prevents the protection element 15 from blocking the light from the light emitting diode 13, and thereby suppresses deterioration in luminous efficiency of the light emitting diode 13.

Further, one of the two electrodes of the light emitting diode 13 is electrically connected to a first inner lead 16, while the other electrode of the light emitting diode 13 is electrically connected to a second inner lead 17. An electrode on an upper surface of the protection element 15 is electrically connected to the first inner lead 16, while an electrode on a lower surface of the protection element 15 is electrically connected to the metal tab 14.

These conventional light emitting devices having protection elements have following problems.

In the conventional light emitting device described in the Patent Literature 1, the opening 4 for the protection element is provided independently of the opening 3 for the light emitting element 2 and these openings are arranged in the longitudinal direction of the package 1 made of resin. This causes a problem of increased longitudinal length of the package 1. Further, provision of a plurality of openings 3, 4 in the package 1 tends to complicate the manufacturing process of the package 1, which in turn causes increased manufacturing costs of the light emitting element packages.

As shown in FIG. 14, the center of the package 1 is not necessarily the center of the opening 3 for the light emitting element 2, which causes a problem of displaced light emitting axis.

The light emitting device described in the Patent Literature 2 has the metal tab 14 which is formed for mounting the protection element 15 and which has an upper surface lower than that of the heat radiating member 12 for mounting the light emitting diode 13. The metal tab 14 and the second inner lead 17 are connected with a wire so as to electrically connect the electrode on the lower surface of the protection element 15 and the second inner lead 17 to establish parallel connection between the light emitting diode 13 and the protection element 15.

Necessity of forming the metal tab 14 and connecting the metal tab 14 to the second inner lead 17 with a wire causes a problem of complicated manufacture process of packages and hence increased manufacturing costs of the light emitting device.

CITATION LIST

Patent Literature

PTL1: JP 2007-280983 A
PTL2: WO 2007/069399 A

SUMMARY OF THE INVENTION

Technical Problem

Accordingly, an object of the present invention is to provide a light emitting device at low costs with high reliability, while suppressing deterioration in luminance of light emitting elements due to the existence of a protection element.

Solution to Problem

A light emitting device according to an aspect of the present invention includes:
at least one light emitting element;
a protection element having an electrode;
a first lead terminal including a first end portion and a second end portion and on which the protection element is mounted;
a second lead terminal which is generally flush with the first lead terminal and on which the light emitting element is mounted, the second lead terminal including a first end portion which faces the second end portion of the first lead terminal; and
a resin section covering the first lead terminal and the second lead terminal so as to expose the first end portion of the first lead terminal and the second end portion of the second lead terminal, the resin section having a cavity formed to expose a mounting surface for the protection element of the first lead terminal and a mounting surface for the light emitting element of the second lead terminal,
wherein a recess section is provided on the mounting surface for the light emitting element of the second lead terminal positioned inside the cavity, the light emitting element being mounted on a bottom of the recess section, wherein the protection element is mounted on the mounting surface for the protection element of the first lead terminal positioned inside the cavity, and wherein the electrode of the protection element and the second lead terminal are electrically connected through a bonding wire.

According to the configuration stated above, the second lead terminal on which a light emitting element is mounted is generally flush with the first lead terminal on which a protection element is mounted. And, the light emitting element is mounted on the bottom of the recess section formed in the mounting surface for the light emitting element of the second lead terminal. As compared with this configuration, the protection element is mounted on the mounting surface for the protection element of the first lead terminal. It follows that the protection element is placed above the light emitting element. In this specification, the word "above", "upper", "higher" or the like refers to a cavity opening side, i.e., a direction closer to the cavity opening.

The light emitted from the light emitting element is reflected to an outgoing direction by a sidewall of the recess section. This makes it hard for the reflected light reflected by the sidewall to reach the protection element placed on the first lead terminal in a position distant from the sidewall of the second lead terminal.

Therefore, it becomes possible to suppress absorption of light from the light emitting element by the protection element and to prevent deterioration in luminance of the light emitted from the light emitting device.

Further, the light emitting element is mounted on the bottom of the recess section of the second lead terminal positioned inside the cavity, while the protection element is mounted on the mounting surface of the first lead terminal positioned inside the cavity. Thus, the light emitting element and the protection element are placed inside a single cavity provided in the resin section, so that the longitudinal size of the light emitting device can be small while simple configuration can be achieved. Further, it becomes easy to set the cavity such that the center of the cavity, which is an opening for the light emitting element, is aligned with the center of the package, and thereby the light emitting device can be placed without causing displacement of the light emitting axis.

In conclusion, accordingly to the present invention, it becomes possible to provide a light emitting device at low costs with high reliability, while suppressing deterioration in luminance of the light emitting elements due to the existence of the protection element.

A light emitting device according to another aspect of the present invention includes:

a first lead terminal having a mounting surface;

a second lead terminal having a mounting surface and facing the first lead terminal with a distance from the first lead terminal;

a protection element mounted on the mounting surface of the first lead terminal;

at least one light emitting element mounted on the mounting surface of the second lead terminal; and a resin section having a cavity to expose the mounting surface of the first lead terminal and the mounting surface of the second lead terminal and covering the first lead terminal and the second lead terminal, wherein, of the first lead terminal and the second lead terminal, at least the second lead terminal has a recess section on the mounting surface positioned inside the cavity, wherein the at least one light emitting element is mounted on a bottom of the recess section of the second lead terminal, and a wall surface defining the recess section functions as a reflective surface for reflecting light emitted from the light emitting element, and wherein the protection element is mounted on a mounting surface portion of the first lead terminal positioned inside the cavity, the mounting surface portion being positioned closer to a cavity opening than the bottom of the recess section.

According to the configuration stated above, the protection element is placed above the light emitting element. The light emitted from the light emitting element is reflected to an outgoing direction by a sidewall of the recess section. This makes it hard for the reflected light reflected by the sidewall to reach the protection element placed on the first lead terminal in a position distant from the sidewall of the second lead terminal.

Therefore, it becomes possible to suppress absorption of light from the light emitting element by the protection element and to prevent deterioration in luminance of the light emitted from the light emitting device.

Further, the light emitting element is mounted on the bottom of the recess section of the second lead terminal positioned inside the cavity, while the protection element is mounted on the mounting surface of the first lead terminal positioned inside the cavity. Thus, the light emitting element and the protection element are placed inside a single cavity provided in the resin section, so that the longitudinal size of the light emitting device can be small while simple configuration can be achieved. Further, it becomes easy to set the cavity such that the center of the cavity, which is an opening for the light emitting element, is aligned with the center of the package, and thereby the light emitting device can be placed without causing displacement of the light emitting axis.

In one embodiment, the light emitting device has a plurality of light emitting elements, which are arranged in parallel with each other and electrically connected in parallel, and the electrode of the protection element is electrically connected to the bottom of the recess section in the second lead terminal through a bonding wire.

According to this embodiment, because the plurality of light emitting elements are arranged in parallel with each other, a vacant area is generated at the bottom of the recess section of the second lead terminal on which the light emitting elements are mounted. Therefore, applying wire bonding in the vacant area at the bottom of the recess section makes it possible to achieve improvement in recognition property at the time of bonding and to achieve reduction in peeling of wire.

In one embodiment, the recess section formed in the second lead terminal is in a rectangular shape, and the plurality of light emitting elements are placed such that a long side of each of the light emitting elements is generally in parallel with a shorter side of the rectangular recess section.

According to this embodiment, the long side of the light emitting element is made generally in parallel with the shorter side of the recess section of the second lead terminal, so that the light emitting elements can be arranged generally at a regular interval and in parallel to each other along a direction in which the long side of the recess section extends. Therefore, it is possible to provide a large interval between the long sides of the light emitting elements arranged in parallel inside the recess section to thereby suppress absorption of light emitted from the light emitting elements. Further, it is possible to provide a large interval between the long side of a light emitting element and a shorter side of the recess section to thereby achieve sufficient reflection effect of the light, emitted from the light emitting element, by the sidewall of the recess section. That is, reduction in optical output can be suppressed.

A light emitting device according to a further aspect of the present invention includes:

at least one light emitting element;

a protection element having an electrode;

a first lead terminal including a first end portion and a second end portion and on which the protection element is mounted;

a second lead terminal which is generally flush with the first lead terminal and on which the light emitting element is mounted, the second lead terminal including a first end portion which faces the second end portion of the first lead terminal; and a resin section covering the first lead terminal and the second lead terminal so as to expose the first end portion of the first lead terminal and the second end portion of the second lead terminal, the resin section having a cavity formed to expose a mounting surface for the protection element of the first lead terminal and a mounting surface for the light emitting element of the second lead terminal, wherein the second end portion of the first lead terminal positioned inside the cavity has a first recess section formed to have a rectangular shape with three sides forming wall surfaces and a remaining one side being open at an extremity of the second end portion of the first lead terminal, and the protection element is mounted outside the first recess section, wherein the first end portion of the second lead terminal positioned inside the cavity has a second recess section in a rectangular shape with three sides forming wall surfaces and a remaining one side being open at an extremity of the first end portion of the second lead terminal, and the light emitting element is mounted on a bottom of the second recess section, wherein a space between the second end portion of the first lead terminal and the first end portion of the second lead terminal, which face each other, is filled with the resin section, the first recess section and the second recess section forming one recess section together with the resin section, and wherein the electrode of the protection element and the second lead terminal are electrically connected through a bonding wire.

According to the configuration stated above, the second lead terminal on which a light emitting element is mounted is generally flush with the first lead terminal on which a protection element is mounted. And, the light emitting element is mounted on the bottom of the second recess section formed in the mounting surface for the light emitting element of the second lead terminal. As compared with this, the protection element is mounted outside of the first recess section in the mounting surface for the protection element of the first lead terminal. It follows that the protection element is placed above the light emitting element.

The light emitted from the light emitting element is reflected to an outgoing direction by a sidewall of the single recess section formed of the first and second recess sections. This makes it hard for the reflected light reflected by the sidewall to reach the protection element placed on the first lead terminal in a position distant from the sidewall of the second lead terminal.

Therefore, it becomes possible to suppress absorption of light from the light emitting element by the protection element and to prevent deterioration in luminance of the light emitted from the light emitting device.

Further, the light emitting element is mounted on the bottom of the recess section of the second lead terminal positioned inside the cavity, while the protection element is mounted outside of the recess section in the mounting surface of the first lead terminal positioned inside the cavity. Thus, the light emitting element and the protection element are placed inside a single cavity provided in the resin section, so that the longitudinal size of the light emitting device can be small while simple configuration can be achieved. Further, it becomes easy to set the cavity such that the center of the cavity, which is an opening for the light emitting element, is aligned with the center of the package, and thereby the light emitting device can be placed without causing displacement of the light emitting axis.

In conclusion, according to the present invention, it becomes possible to provide a light emitting device at low costs with high reliability, while suppressing deterioration in luminance of the light emitting elements due to the existence of the protection element.

In one embodiment, the electrode of the protection element is electrically connected to outside of the recess section in the second lead terminal through bonding wire.

According to the embodiment, the electrode of the protection element is electrically connected to outside of the recess section in the second lead terminal through a bonding wire. Therefore, by setting an electric connection part such that the length of the bonding wire is minimized, it becomes possible to suppress light shading and light absorption caused by the bonding wire for the protection element.

In one embodiment, the protection element is mounted on a surface of the first lead terminal located at a position higher than the light emitting element which is mounted on the bottom of the recess section of the second lead terminal.

According to this embodiment, the protection element is mounted above, i.e., in a higher position than the light emitting element. This makes it hard for the light emitted from the light emitting element and reflected by the sidewall of a single recess section formed of the first recess section and the second recess section to reach the protection element mounted on the first lead terminal in a position distant from the sidewall of the second lead terminal.

In one embodiment, the first lead terminal mounted with the protection element has a smaller area that is exposed to an inside of the cavity formed in the resin section than the second lead terminal.

According to this embodiment, the protection element is mounted on the first lead terminal having a smaller area that is exposed to the inside of the cavity. Therefore, it easily becomes possible to form a large first recess section in the second lead terminal having a larger area that is exposed to the inside of the cavity and to mount a plurality of light emitting elements on the larger first recess section.

Advantageous Effects of Invention

As is apparent from the above, in the light emitting device of the present invention, the light emitting element is mounted on the bottom of the recess in the second lead terminal such that the protection element is mounted above the light emitting element. This makes it hard for the light emitted from the light emitting element and reflected by the sidewall of a single recess section formed from the first recess section and the second recess section to reach the protection element mounted on the first lead terminal in a position distant from the sidewall of the second lead terminal.

Therefore, it becomes possible to suppress absorption of light from the light emitting element by the protection element and to prevent deterioration in luminance of the light emitted from the light emitting device.

Further, the light emitting element is mounted on the second lead terminal positioned inside the cavity, while the protection element is mounted on the first lead terminal positioned inside the cavity. Thus, the longitudinal size of the light emitting device can be small while simple configuration can be achieved. Further, it becomes easy to set the cavity such that the center of the cavity, which is an opening for the light emitting element, is aligned with the center of the package, and thereby the light emitting device can be placed without causing displacement of the light emitting axis.

In conclusion, according to the present invention, it becomes possible to provide a light emitting device at low costs with high reliability, while suppressing deterioration in luminance of the light emitting elements due to the existence of the protection element.

BRIEF DESCRIPTION OF DRAWINGS

The present invention will become more fully understood from the detailed description given hereinbelow and the accompanying drawings which are given by way of illustration only, and thus are not intended to limit the present invention, and wherein.

DESCRIPTION OF EMBODIMENTS

Hereinbelow, the invention will be described in detail in conjunction with the embodiments with reference to the drawings.

First Embodiment

Figure 1:
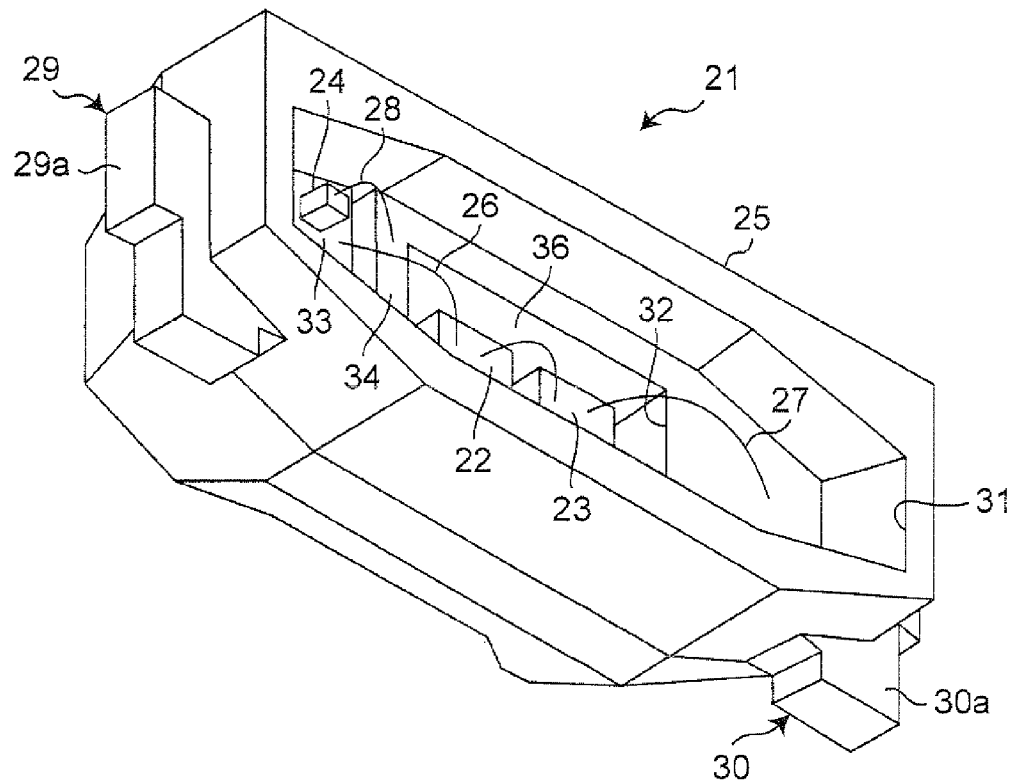
FIG. 1 is a perspective view of a light emitting device according to the present invention.
Figure 2:
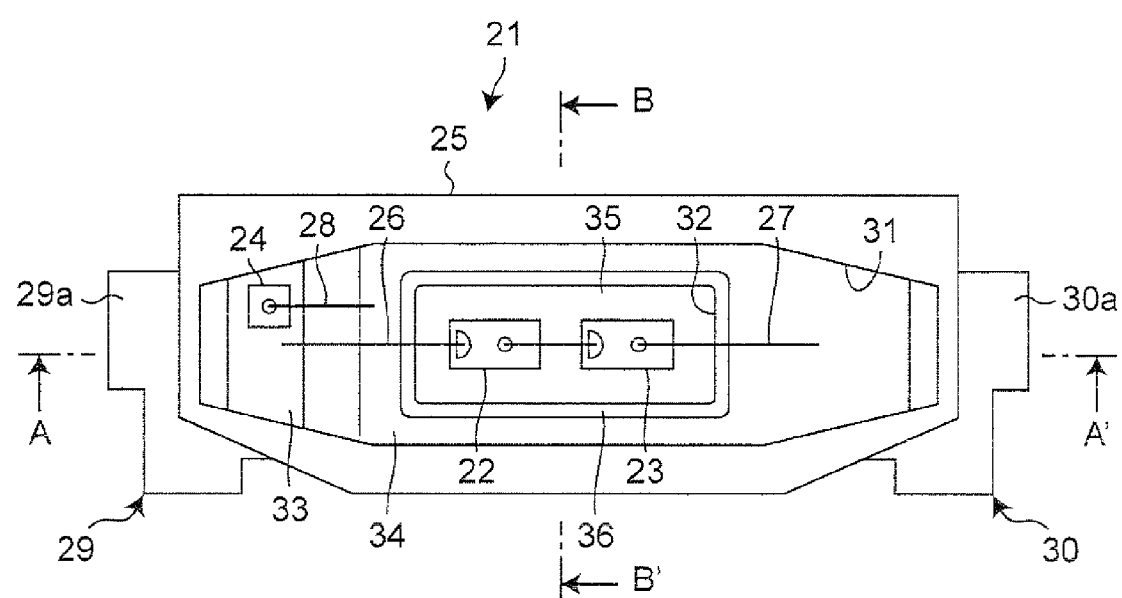
FIG. 2 is a plan view of the light emitting device shown in FIG. 1.

FIG. 1 is a perspective view showing a light emitting device in this embodiment. FIG. 2 is a plan view showing the light emitting device shown in FIG. 1. As shown in FIG. 1 and FIG. 2, the light emitting device 21 includes two light emitting diode chips 22, 23 as light emitting elements, a Zener diode 24 as a protection element, a resin section 25, bonding wires 26, 27 for the light emitting diode chips, a bonding wire 28 for the Zener diode, a first lead terminal 29, and a second lead terminal 30. Each of the first lead terminal 29 and the second lead terminal 30 has a first end portion and a second end portion.

Figure 3:
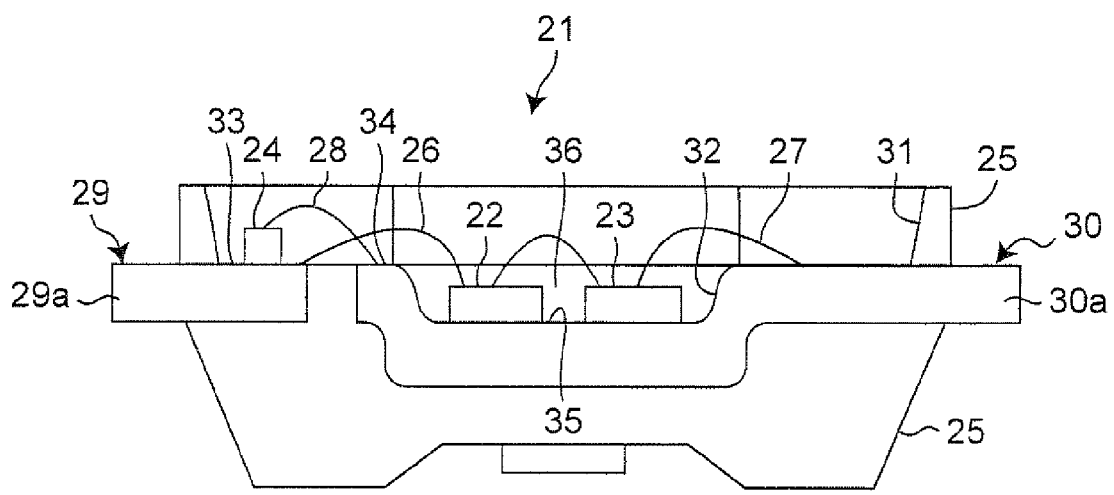
FIG. 3 is a cross sectional view taken along the line A-A' in FIG. 2.

FIG. 3 is a cross sectional view taken along the line A-A' in FIG. 2. As shown in FIG. 3, the first lead terminal 29 and the second lead terminal 30 are placed so that an upper surface of the first lead terminal 29 and an upper surface of the second lead terminal 30 are generally flush with each other and that one end of each of these terminals (a second end portion of the first lead terminal 29 and a first end portion of the second lead terminal 30) face each other.

The resin section 25 covers the first lead terminal 29 and the second lead terminal 30 so as to expose the first end portion of the first lead terminal 29 (which functions as a later-described first terminal section 29a) and the second end portion of the second lead terminal 30 (which functions as a later-described second terminal section 30a). A cavity 31 is formed above the first lead terminal 29 and the second lead terminal 30 in the resin section 25, with the most part of the upper surface of the first lead terminal 29 and the second lead terminal 30 being exposed to the inside of the cavity 31. The Zener diode 24 and the light emitting diode chips 22, 23 are mounted on the first lead terminal 29 and the second lead terminal 30 inside the cavity 31.

That is, the upper surface of the first lead terminal 29 constitutes the mounting surface for the protection element (Zener diode 24). The upper surface of the second lead terminal 30 constitutes the mounting surface for the light emitting elements (light emitting diode chips 22, 23).

The light emitting diode chips 22, 23 are housed in a recess section 32 formed in the upper surface of the second lead terminal 30 inside the cavity 31 and mounted thereon, and are connected respectively to the first lead terminal 29 and the second lead terminal 30 through the bonding wires 26, 27 inside the cavity 31. Used as the light emitting diode chips 22, 23 are 0.3 mm wide and 0.6 mm long GaN-based blue light emitting diode chips. In this case, the recess section 32 has a rectangular opening in plane view as shown in FIG. 2.

The Zener diode 24 is fixed onto the first lead terminal 29 with electrically conductive adhesives (silver paste in this embodiment), with an electrode on the top face thereof being electrically connected to a peripheral portion (flange) of the recess section 32 in the second lead terminal 30 through the bonding wire 28.

As shown in FIG. 3, the Zener diode 24 is inside the cavity 31 and is mounted on the first lead terminal 29. More specifically, the Zener diode 24 is mounted on the upper surface, in an area (inner lead) 33 inside the cavity 31, of the first lead terminal 29. Two light emitting diode chips 22, 23 are placed in a portion inside the cavity 31 and inside the recess section 32 of the second lead terminal 30. Thus, the Zener diode 24 is placed above the light emitting diode chips 22, 23 placed inside the recess section 32 of the second lead terminal 30.

The electrode on the top face of the Zener diode is connected by the bonding wire 28 to an extended section 34 (flange of the recess section 32) which extends from the recess section 32 of the second lead terminal 30 toward the first lead terminal 29 and which is positioned generally in the same height as the first lead terminal 29.

Figure 4:
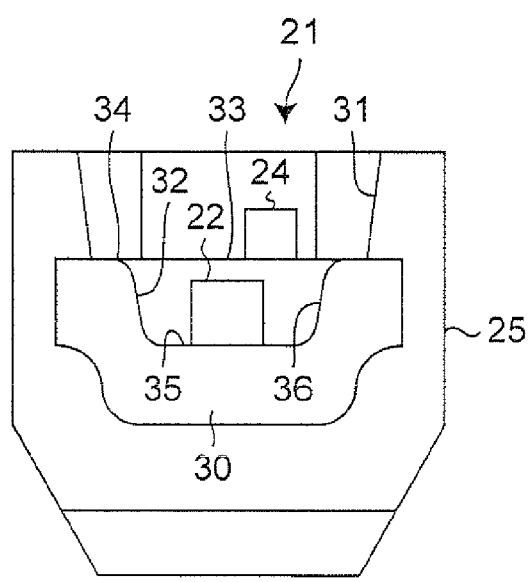
FIG. 4 is a cross sectional view taken along the line B-B' in FIG. 2.

FIG. 4 is a cross sectional view taken along the line B-B' in FIG. 2. In FIG. 4, bonding wires including bonding wires 26, 27, 28 are omitted.

As shown in FIGS. 1 to 4, the light emitting diode chips 22, 23 are placed inside the recess section 32 of the second lead terminal 30, the Zener diode 24 is mounted on the rear side of the light emitting diode chip 22 in FIG. 4, and the Zener diode 24 is mounted on the upper side of the light emitting diode chips 22, 23 inside the recess section 32 of the second lead terminal 30.

As mentioned above, the Zener diode 24 is fixed onto the first lead terminal 29 with electrically conductive adhesives (silver paste), and the electrode on the top face of the Zener diode 24 and the flange 34 (which is as high as the upper surface of the first lead terminal 29) of the recess section 32 of the second lead terminal 30 are electrically connected through the bonding wire 28.

A flat bottom 35 used as a mounting region for the light emitting diode chips 22, 23 is formed in the recess section 32 of the second lead terminal 30. A sidewall 36 continuing to the bottom 35 is also formed in the recess section 32 of the second lead terminal 30. In other words, the bottom 35 and the sidewall 36 constitute the recess section 32.

The sidewall 36 of the recess section 32 is formed to have a slight inclination toward a vertical line extending from the surface of the bottom 35 so that an opening of the recess section 32 increases toward the upper surface of the second lead terminal 30. The wall surface of the sidewall 36 functions as a reflective surface to reflect the light emitted from the light emitting diode chips 22, 23. Therefore, the light which was emitted from the light emitting diode chips 22, 23 and was reflected by the sidewall 36 passes the cavity 31 of the resin section 25 and goes out of the light emitting device 21.

In this embodiment, the recess section 32 is dimensioned to have a short side of 0.4 mm, a long side of 1.6 mm, and a depth of 0.2 mm. The cavity 31 is dimensioned to have a short side of 0.6 mm, a long side of 2.4 mm, and a depth of 0.3 mm.

As mentioned above, the Zener diode 24 is mounted on the first lead terminal 29 inside the cavity 31 of the resin section 25. That is, the Zener diode 24 is mounted above the light emitting diode chips 22, 23 mounted on the bottom 35 of the recess section 32 in the second lead terminal 30. Since the light emitted from the light emitting diode chips 22, 23 is reflected by the sidewall 36 of the recess section 32 in the direction outgoing from the light emitting device 21, the reflected light reflected by the sidewall 36 is hard to reach the Zener diode 24 mounted on the first lead terminal 29 at a position distant from the sidewall 36 of the second lead terminal 30. Therefore, it becomes possible to suppress absorption of the light from the light emitting diode chips 22, 23 by the Zener diode 24 and to prevent deterioration in luminance of the light emitted from the light emitting device 21.

With respect to the light emitting diode chip 22 out of the light emitting diode chips 22, 23 aligned in a straight line, the Zener diode 24 is placed in an opposite direction of the light emitting diode chip 23 and is connected in parallel with the light emitting diode chip 22, by which the light emitting diode chips 22, 23 are protected from dielectric breakdown by static electricity.

The light emitting diode chips 22, 23, which are GaN-based blue light emitting diode chips, are relatively small in electrostatic breakdown resistance and may be destructed upon application of high surge voltage. Accordingly, a protection element such as Zener diode 24 is mounted together with the light emitting diode chips 22, 23 for electrostatic protection.

The first lead terminal 29 has a first terminal section 29a extending like a plate toward the outside of the resin section 25. Bending is not applied to the first terminal section 29a. Similarly, the second lead terminal 30 has a second terminal section 30a extending like a plate toward the outside of the resin section 25. Bending is not applied to the second terminal section 30a.

The recess section 32 of the second lead terminal 30 is filled with silicon resin (not shown) to resin-seal the light emitting diode chips 22, 23 inside the recess section 32. The curing conditions of the silicon resin include curing time of 1 hour and curing temperature of 80° C. The cavity 31 of the resin section 25 is filled with a light permeable molding member (not shown) to seal the Zener diode 24 and the bonding wires 26, 27, 28 inside the cavity 31. The curing conditions of the light permeable molding member include curing time of 5 hours and curing temperature of 150° C.

In this embodiment, as mentioned above, the Zener diode 24 as a protection element is mounted on the first lead terminal 29 (inner lead 33) exposed to the inside of the cavity 31 provided in the resin section 25. The light emitting diode chips 22, 23 as light emitting elements are exposed to the inside of the cavity 31 and are mounted on the bottom 35 of the recess section 32 provided in the second lead terminal 30 placed generally in the same face as the first lead terminal 29. Thus, placing the Zener diode 24 above the light emitting diode chips 22, 23, can make it hard for the light, which was emitted from the light emitting diode chips 22, 23 and reflected by the sidewall 36 of the recess section 32 in the outgoing direction, to reach the Zener diode 22.

Therefore, it becomes possible to suppress absorption of the light, which was emitted from the light emitting diode chips 22, 23, by the Zener diode 24 and to prevent deterioration in luminance of the light emitted from the light emitting device 21.

Moreover, the Zener diode 24 is mounted on the inner lead 33 formed so as to be exposed to the inside of the cavity 31 of the resin section 25 in the first lead terminal 29, while the light emitting diode chips 22, 23 are mounted on the recess section 32 provided so as to be exposed to the inside of the cavity 31 of the second lead terminal 30. Thus, placing the light emitting diode chips 22, 23 and the Zener diode 24 in one cavity 31 provided in the resin section 25 makes it possible to keep the longitudinal size of the light emitting device 21 small. Further, it becomes easy to so set that the center of the cavity 31, which is an opening for the light emitting elements, is aligned with the center of the package, and thereby the light emitting device 21 can be placed without causing displacement of its light emitting axis.

According to this embodiment, as described above, providing only one cavity 31 in the resin section 25 can simplify manufacturing process of packages, and thereby increase in manufacturing costs of the light emitting device 21 can be suppressed. In other words, it becomes possible to provide a light emitting device at low costs with high reliability, while suppressing deterioration in luminance of the light emitting elements due to the existence of the protection element.

For comparison, a light emitting device was produced in which a Zener diode and light emitting diode chips 22, 23 were mounted inside the recess section 32 of the second lead terminal 30. It was found out that in this comparative example, an optical output was decreased by 4% to 5% as compared with the light emitting device 21 of the present embodiment.

Although the light emitting device shown in FIGS. 1 to 4 has two light emitting elements, the number of light emitting elements may be only one or may be three or more without being limited to the number OL two.

MODIFIED EXAMPLE

Figure 5:
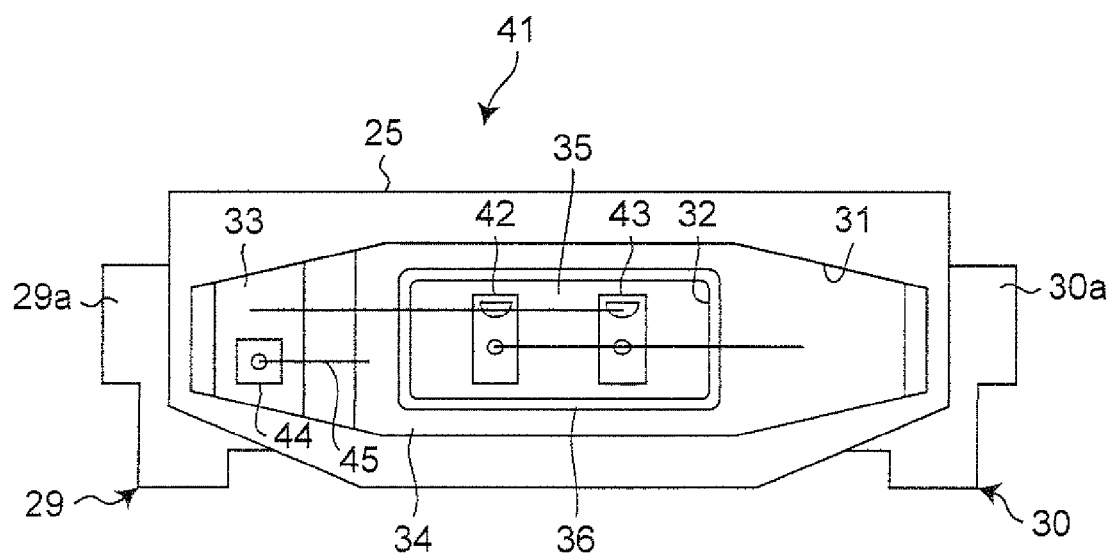
FIG. 5 is a plan view of a light emitting device different from that of FIG. 1.

Hereinbelow, description will be given of a modified example of the first embodiment. FIG. 5 is a plan view of a light emitting device 41 in this modified example. In FIG. 5, the members identical to those in the first embodiment are designated by identical reference numerals to omit detailed explanation.

In this modified example, two light emitting diode chips 42 and 43 are placed in parallel in a recess section 32 of a second lead terminal 30 and are electrically connected in parallel with each other.

A Zener diode 44 is mounted on an area (inner lead) 33 exposed to the inside of a cavity 31 of a resin section 25 in a first lead terminal 29. The two light emitting diode chips 42, 43 are placed in the recess section 32 of the second lead terminal 30 which is generally flush with the first lead terminal 29. Thus, the Zener diode 44 is placed above the light emitting diode chips 42, 43.

An electrode on the top face of the Zener diode 44 is connected by a bonding wire 45 to an extended section 34 (flange of the recess section 32) which extends from the recess section 32 of the second lead terminal 30 toward the first lead terminal 29 and which is positioned generally in the same height as the first lead terminal 29.

In this modified example, the light emitting diode chips 42, 43 are laid so that the long sides of the light emitting diode chips 42, 43 are generally in parallel with the shorter side of the recess section 32. Thus, the long sides of the light emitting diode chips 42, 43 are provided generally in parallel with the shorter side of the recess section 32, so that the light emitting diode chips 42, 43 are arranged generally at a regular interval and in parallel in the long side direction of the recess section 32. Accordingly, a large interval can be provided between the long sides of the light emitting diode chips 42, 43 arranged in parallel inside the recess section 32, so that absorption of the light emitted from the light emitting diode chips 42, 43 can be suppressed. Further, a large interval can be provided between the long side of the light emitting diode chip 42 and the shorter side of the recess section 32, and between the long side of the light emitting diode chip 43 and the shorter side of the recess section 32, which makes it possible to achieve sufficient reflection effect of the light emitted from the light emitting diode chips 42, 43 and reflected by the sidewall of the recess section 32. Therefore, reduction in optical output can be suppressed.

Figure 6:
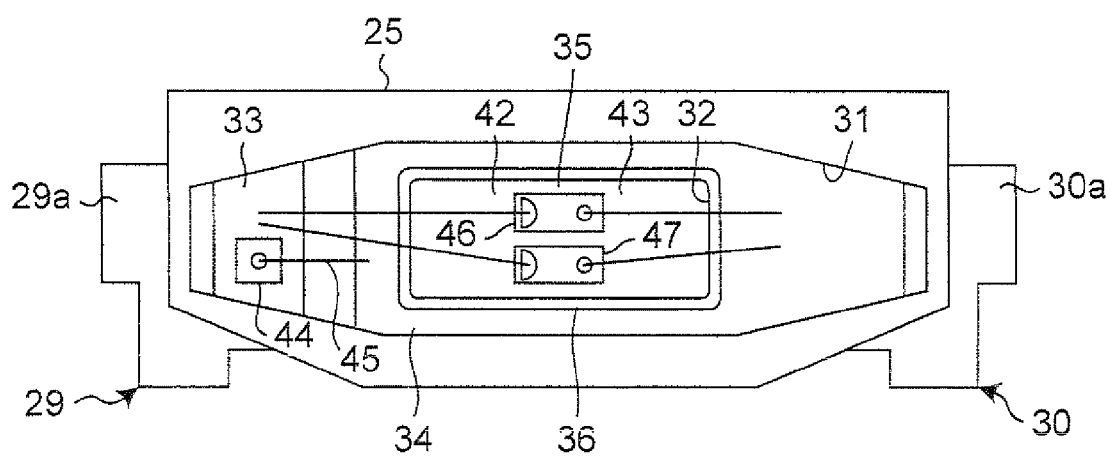
FIG. 6 is an explanatory view of the light emitting device in FIG. 5 in which the long sides of light emitting diode chips are made generally in parallel with the long side of a recess section.

As compared with this modified example, when two light emitting diode chips 46, 47 arranged in parallel are laid so that the long sides of the light emitting diode chips 46, 47 are generally in parallel with the long side of the recess section 32 as shown in FIG. 6, the light emitting diode chips 46, 47 are to be arranged generally at a regular interval and in parallel in the shorter side direction of the recess section 32. Accordingly, an interval between the long sides of the light emitting diode chips 46, 47 arranged in parallel inside the recess section 32 becomes smaller, which causes absorption of the light emitted from the light emitting diode chips 46, 47. Further, a space between the long side of the light emitting diode chip 46 and the long side of the recess section 32 and a space between the long side of the light emitting diode chip 47 and the long side of the recess section 32 become smaller, which makes it impossible to achieve sufficient reflection effect of the light emitted from the light emitting diode chips 46, 47 and reflected by the sidewall 36 of the recess section 32. Therefore, an optical output is reduced. Moreover, since four bonding wires are needed, it becomes difficult to bond to the inner lead 33 of the first lead terminal 29.

As described above, the Zener diode 44 as a protection element is mounted on the first lead terminal 29 exposed to the inside of the cavity 31 provided in the resin section 25. Moreover, the light emitting diode chips 42, 43 as light emitting elements are exposed to the inside of the cavity 31 and are mounted on the bottom 35 of the recess section 32 in the second lead terminal 30 placed generally in the same face as the first lead terminal 29. Thus, placing the Zener diode 44 above the light emitting diode chips 42, 43 can make it hard for the light, which was emitted from the light emitting diode chips 42, 43 and reflected by the sidewall 36 of the recess section 32 in the outgoing direction, to reach the Zener diode 44.

Therefore, it becomes possible to suppress absorption of the light, which was emitted from the light emitting diode chips 42, 43, by the Zener diode 44 and to prevent deterioration in luminance of the light emitted from the light emitting device 41.

Moreover, the Zener diode 44 is mounted on the inner lead 33 exposed to the inside of the cavity 31 of the resin section 25 in the first lead terminal 29, while the light emitting diode chips 42, 43 are mounted on the recess section 32 provided so as to be exposed to the inside of the cavity 31 in the second lead terminal 30. Thus, placing the light emitting diode chips 42, 43 and the Zener diode 44 in one cavity 31 provided in the resin section 25 makes it possible to keep the longitudinal size of the light emitting device 21 small. Further, it becomes easy to so set that the center of the cavity 31 is aligned with the center of the package.

Further, since the long sides of the light emitting diode chips 42, 43 are generally in parallel with the shorter side of the recess section 32 of the second lead terminal 30, reduction in optical output can be suppressed.

In this modified example, the electrode on the top face of the Zener diode 44 is wire-bonded to the flange 34 of the recess section 32 in the second lead terminal 30. However, the bonding wire 45 may be connected to the bottom 35 of the recess section 32 of the second lead terminal 30. In this modified example, the long sides of the light emitting diode chips 42, 43 are made generally in parallel with the shorter side of the recess section 32, so that a vacant area is formed on the bottom 35 of the recess section 32 as compared with the case of the first embodiment. Therefore, application of wire bonding in the vacant area on the bottom 35 in the recess section 32 leads to improvement in bonding nature (i.e., improvement in recognition property at the time of bonding and reduction in peeling of wire).

It is to be noted that a vacant area can also be provided on the bottom 35 of the recess section 32 in the second lead terminal 30 by mounting the light emitting diode chips 42, 43 aslant with respect to the shorter side of the recess section 32 and in parallel with each other on the recess section 32. Therefore, improvement in bonding nature can also be achieved in this case.

Although the two light emitting diode chips 42, 43 are connected in parallel in this modified example, three or more light emitting diode chips may be connected in parallel.

Second Embodiment

Figure 7:
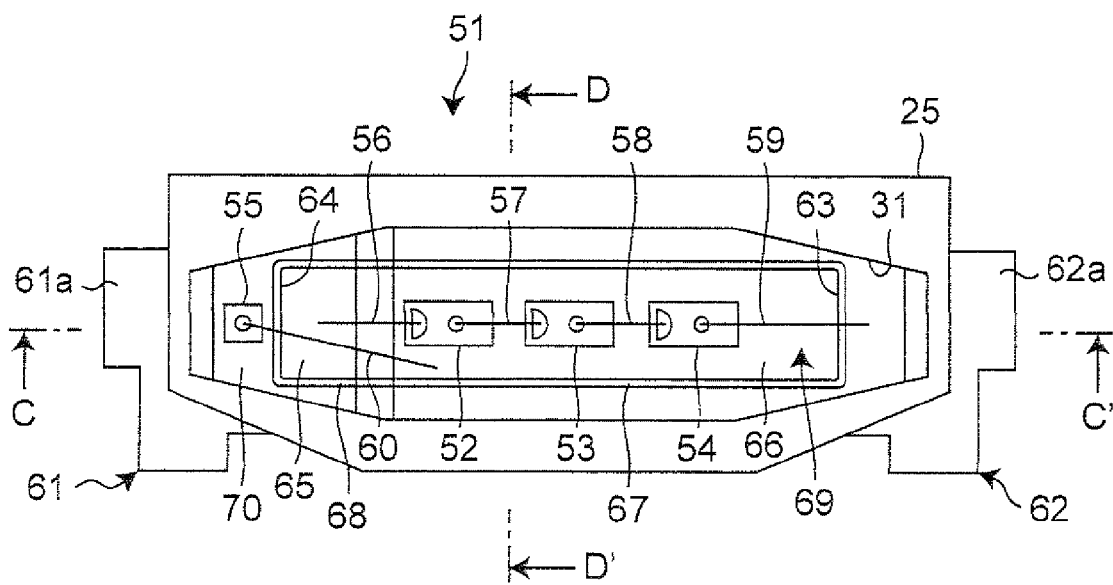
FIG. 7 is a plan view of a light emitting device different from those in FIGS. 1 and 5.

FIG. 7 is a plan view showing a light emitting device in this embodiment. In FIG. 7, the configurations other than those of a first lead terminal, a second lead terminal and relevant members are identical to those in the first embodiment, and therefore members identical to those in the first embodiment are designated by identical reference numerals to omit detailed explanation.

As shown in FIG. 7, the light emitting device 51 includes three light emitting diode chips 52, 53, 54 as light emitting elements, a Zener diode 55 as a protection element, a resin section 25, bonding wires 56 to 59 for the light emitting diode chips, a bonding wire 60 for the Zener diode, a first lead terminal 61, and a second lead terminal 62. The first lead terminal 61 and the second lead terminal 62 each have a first end portion and a second end portion.

Figure 8:
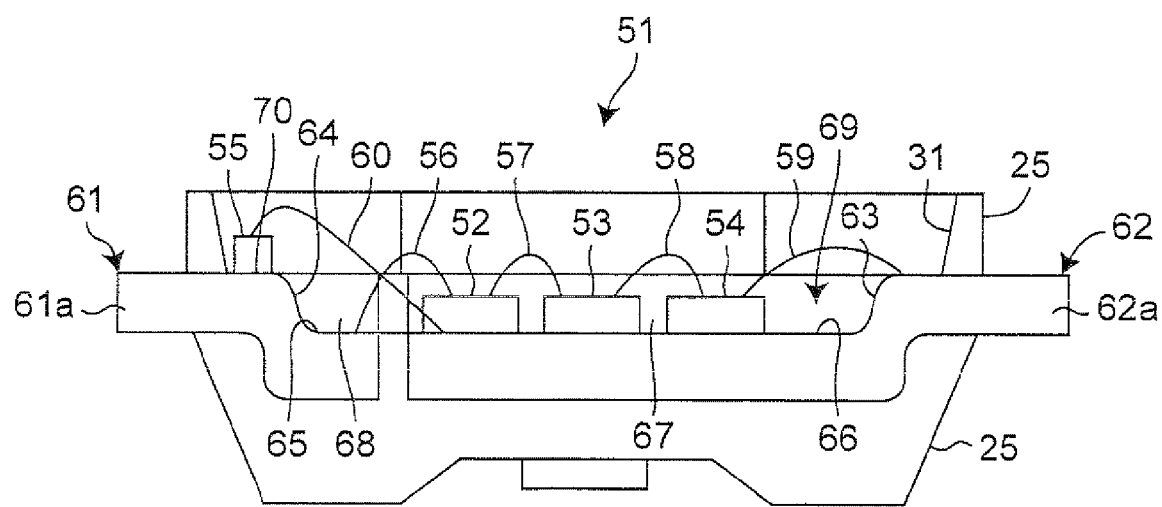
FIG. 8 is a cross sectional view taken along the line C-C' in FIG. 7.
Figure 9:
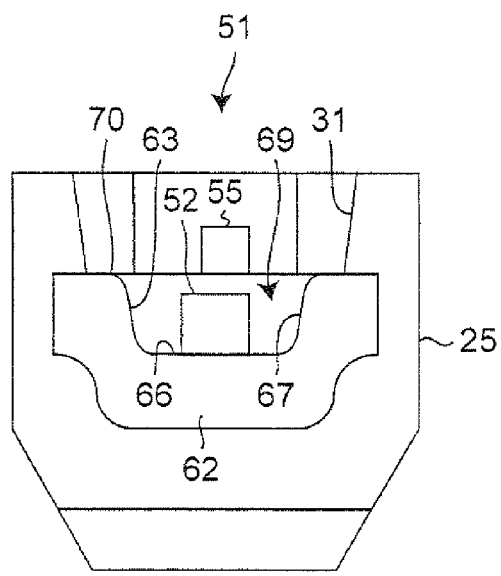
FIG. 9 is a cross sectional view taken along the line D-D' in FIG. 7.

FIG. 8 is a cross sectional view taken along the line C-C' in FIG. 7. FIG. 9 is a cross sectional view taken along the line D-D' in FIG. 7. Bonding wires including bonding wires 56 to 60 are omitted from FIG. 9.

In FIGS. 7 to 9, a recess section 63 used as a mounting region for the light emitting diode chips 52, 53, 54 is formed in the second lead terminal 62. In this case, the first end portion of the second lead terminal 62, i.e., a first lead terminal 61-side end portion of the second lead terminal 62 in the recess section 63 is not formed with a flange positioned generally in the same height as a first terminal section 61a constituted of the first end portion of the first lead terminal 61. In other words, the recess section 63 is opened at the extremity of the first end portion of the second lead terminal 62. In this embodiment, a recess section 64 is formed also in the first lead terminal 61. In the embodiment, the second end portion of the first lead terminal 61, i.e., a second lead terminal 62-side end portion of the first lead terminal 61 in the recess section 64 is not formed with a flange positioned generally in the same height as a second terminal section 62a constituted of the second end portion of the second lead terminal 62. That is, the recess section 64 is opened at the extremity of the second end portion of the first lead terminal 61. The recess section 63 of the second lead terminal 62 and the recess section 64 of the first lead terminal 61 constitute one recess section similar to the recess section 32 in the first embodiment. Hereinafter, the recess section 64 of the first lead terminal 61 is referred to as a first recess section 64, while the recess section 63 of the second lead terminal 62 is referred to as a second recess section 63.

It is to be noted that the depth of the first recess section 64 of the first lead terminal 61 is generally equal to the depth of the second recess section 63 of the second lead terminal 62. A clearance is provided between the second end portion of the first lead terminal 61 and the first end portion of the second lead terminal 62, which is filled up with a resin section 25 from the lower side.

A sidewall 67 continuing to a bottom 66 is formed in the second recess section 63 of the second lead terminal 62. The sidewall 67 of the second recess section 63 is formed to have a slight inclination relative to a vertical line extending from the surface of the bottom 66 so that an opening of the second recess section 63 is widened toward the upper surface of the second lead terminal 62. The wall surface of the sidewall 67 functions as a reflective surface to reflect the light emitted from the light emitting diode chips 52, 53, 54. Therefore, the light emitted from the light emitting diode chips 52, 53, 54 and reflected by the sidewall 67 passes through the cavity 31 of the resin section 25 and goes out of the light emitting device 51.

The first recess section 64 of the first lead terminal 61 has a bottom 65, which looks as if the bottom 66 of the second recess section 63 of the second lead terminal 62 is extended or elongated. Hereinafter, the bottom 65 of the first recess section 64 in the first lead terminal 61 is referred to as an extended bottom 65. The extended bottom 65 of the first recess section 64, the bottom 66 of the second recess section 63, and the surface of the resin section 25 which fills the clearance between the first lead terminals 61 and the second lead terminals 62 form one plane. The first recess section 64 of the first lead terminal 61 has a sidewall 68 continuing to the extended bottom 65, which looks as if the sidewall 67 of the second recess section 63 in the second lead terminal 62 is extended or elongated. Hereinafter, the sidewall 68 of the first recess section 64 in the first lead terminal 61 is referred to as an extended sidewall 68.

The extended sidewall 68 of the first recess section 64 in the first lead terminal 61 is formed to have a slight inclination toward a vertical line extending from the surface of the extended bottom 65 so that an opening of the first recess section 64 increases toward the upper surface of the first lead terminal 61. The wall surface of the extended sidewall 68 of the first recess section 64 functions as a reflective surface to reflect the light emitted from the light emitting diode chips 52, 53, 54. Therefore, the light emitted from the light emitting diode chips 52, 53, 54 and reflected by the extended sidewall 68 passes the cavity 31 of the resin section 25 and goes out of the light emitting device 51.

The first recess section 64 of the first lead terminal 61, the second recess section 63 of the second lead terminal 62, and the surface of the resin section 25 which fills up the clearance between the first recess section 64 and the second recess section 63 constitute one recess section 69. The recess section 69 is dimensioned to have a short side of 0.7 mm, a long side of 2.5 mm, and a depth of 0.2 mm. The cavity 31 is dimensioned to have a short side of 0.9 mm, a long side of 4.5 mm, and a depth of 0.3 mm.

The Zener diode 55 is bonded with silver paste to a flange 70 of the first recess section 64 (i.e., a flange 70 of the recess section 69) on the first lead terminal 61 (inner lead) inside the cavity 31 and is thereby mounted thereon. An electrode on the top face of the Zener diode is connected to the bottom 66 of the second recess section 63 in the second lead terminal 62 through the bonding wire 60.

Therefore, the Zener diode 55 is mounted above the light emitting diode chips 52, 53, 54 mounted on the bottom 66 of the second recess section 63 in the second lead terminal 62. Since the light emitted from the light emitting diode chips 52, 53, 54 is reflected by the sidewall 67, 68 of the recess section 69 in the direction outgoing from the light emitting device 51, it is hard for the reflected light reflected by the sidewall 67, 68 of the recess section 69 to reach the Zener diode 55 mounted on the flange 70 of the recess section 69 on the first lead terminal 61. Therefore, it becomes possible to suppress absorption of the light from the light emitting diode chips 52, 53, 54 by the Zener diode 55 and to prevent deterioration in luminance of the light emitted from the light emitting device 51.

Further, with respect to the light emitting diode chip 52 out of the light emitting diode chips 52, 53, 54 aligned in a straight line, the Zener diode 55 is placed in an opposite direction of the light emitting diode chips 53, and is connected in parallel with the light emitting diode chip 52, by which the light emitting diode chips 52, 54 are protected from dielectric breakdown by static electricity.

The first lead terminal 61 has a first terminal section 61a extending like a plate toward the outside of the resin section 25. Bending is not applied to the first terminal section 61a. Similarly, the second lead terminal 62 has a second terminal section 62a extending like a plate toward the outside of the resin section 25. Bending is not applied to the second terminal section 62a.

In this embodiment, as mentioned above, the first recess section 64 of the first lead terminal 61 and the second recess section 63 of the second lead terminal 62 constitute one recess section 69, and the recess section 69 is placed in one cavity 31. When a plurality of the light emitting diode chips 52, 53, 54 are mounted on the bottom 66 of the second recess section 63 in the second lead terminal 62, the Zener diode 55 is mounted on the flange 70 of the first recess section 64 in the inner lead of the first lead terminal 61. Thus, placing the light emitting diode chips 52, 53, 54 and the Zener diode 55 in one cavity 31 provided in the resin section 25 makes it possible to keep the longitudinal size of the light emitting device 51 small. Further, it becomes easy to so set that the center of the cavity 31, which is an opening for the light emitting elements, is aligned with the center of the package, and thereby the light emitting device 51 can be placed without causing displacement of its light emitting axis.

Moreover, a plurality of the light emitting diode chips 52, 53, 54 are mounted on the second lead terminal 62 having a larger area exposed to the inside of the cavity 31 provided in the resin section 25 out of the first lead terminals 61 and the second lead terminals 62, while the Zener diode 55 is mounted on the first lead terminal 61 having a smaller area exposed to the inside of the cavity 31. With this configuration, it becomes possible to form a large second recess section 63 in the second lead terminal 62 having a larger area exposed to the inside of the cavity 31, and to mount a plurality of the light emitting diode chips 52, 53, 54 inside the second recess section 63.

This also applies to other embodiments including the first embodiment.

Third Embodiment

Figure 10:
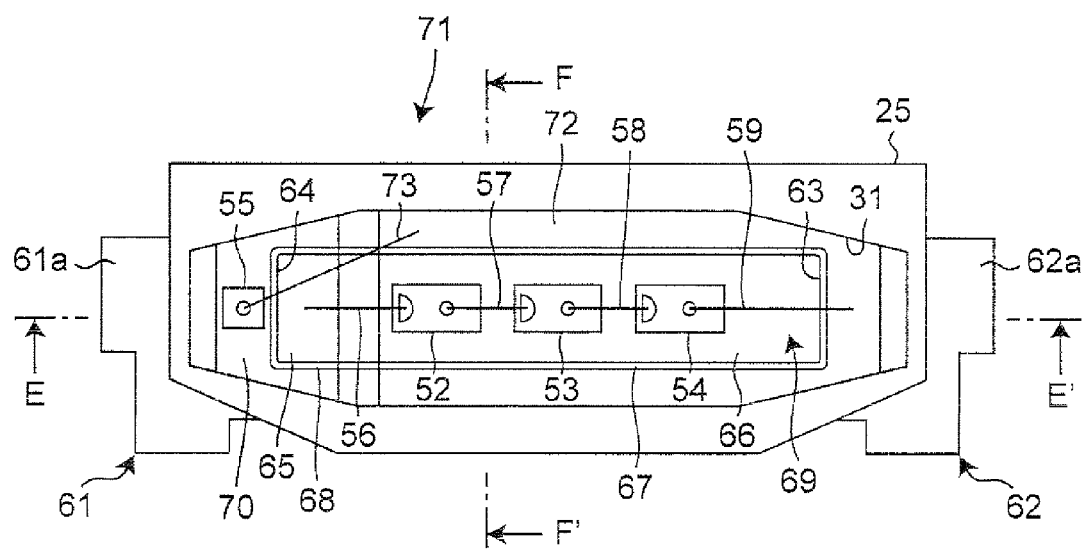
FIG. 10 is a plan view of a light emitting device different from those in FIGS. 1, 5 and 7.
Figure 11:
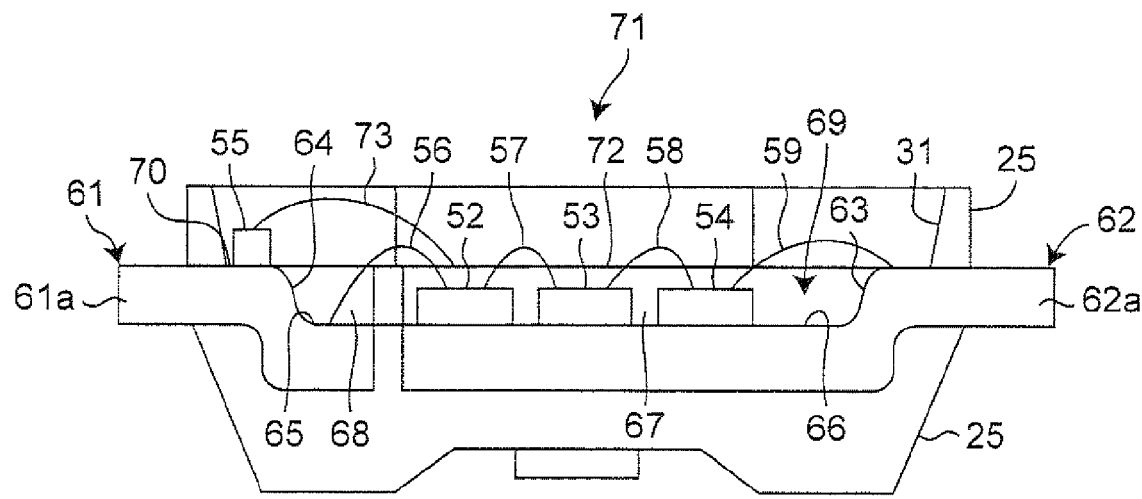
FIG. 11 is a cross sectional view taken along the line E-E' in FIG. 10.
Figure 12:
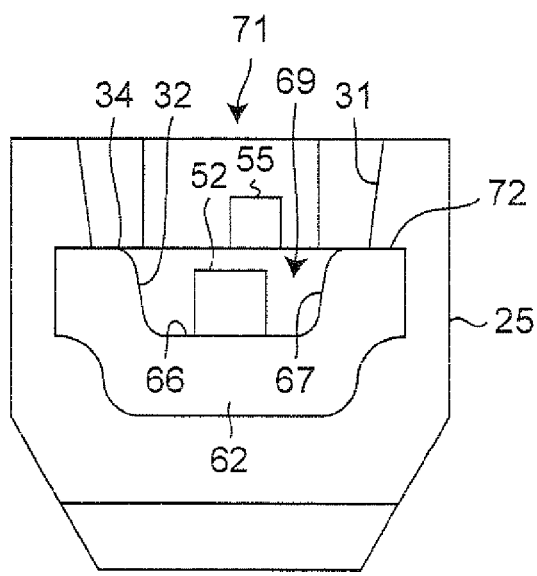
FIG. 12 is a cross sectional view taken along the line F-F' in FIG. 10.

FIG. 10 is a plan view showing a light emitting device in this embodiment. FIG. 11 is a cross sectional view taken along the line D-D' in FIG. 11. FIG. 12 is a cross sectional view taken along the line D-D' in FIG. 12. In FIG. 12, bonding wires are omitted.

In FIGS. 10 to 12 showing the light emitting device 71, the configurations other than that of a wire bonding method of an electrode on the top face of a Zener diode are identical to those in the second embodiment, and therefore members identical to those in the second embodiment are denoted by identical reference numerals to omit detailed explanation.

In this embodiment, an electrode on the top face of a Zener diode 55 is connected by a bonding wire 73 to an area other than a second recess section 63 in a second lead terminal 62 (more specifically, to a flange 72 of a second recess section 63). In this case, it is more preferable to set a connection part so that the length of the bonding wire 73 is minimized.

As stated above, the electrode on the top face of the Zener diode 55 is connected by the bonding wire 73 to an area other than the second recess section 63 in the second lead terminal 62 in this embodiment. Accordingly, it becomes possible to further suppress light shading and light absorption by the bonding wire 73 by setting the electric connection part so that the length of the bonding wire 73 is minimized.

Although omitted in the modified example of the first embodiment and in the second and third embodiments, the silicon resin is filled in the recess sections 32, 69 to resin-seal the light emitting diode chips 42, 43, 52 to 54 inside the recess sections 32, 69 as in the case of the first embodiment. The cavity 31 of the resin section 25 is filled with the light permeable molding member to seal the Zener diode 44, 55 and the bonding wires 45, 56 to 60, 73 inside the cavity 31.

The respective light emitting devices shown in each of the embodiments are used as various light sources.

Figure 13:
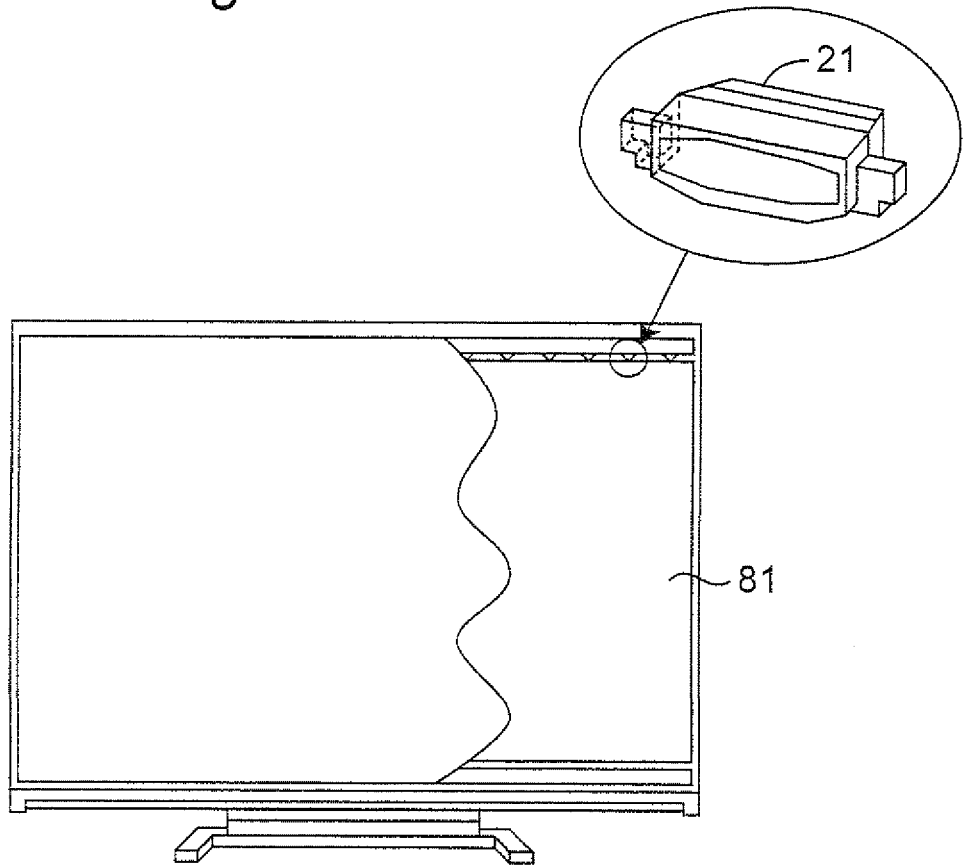
FIG. 13 is a view showing an example in which the light emitting device shown in FIG. 1 is used as a back light source for a liquid crystal display.
Figure 14:
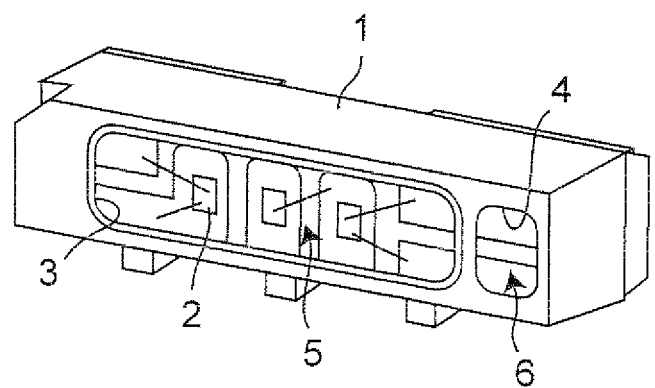
FIG. 14 is a perspective view of a conventional light emitting device.
Figure 15:
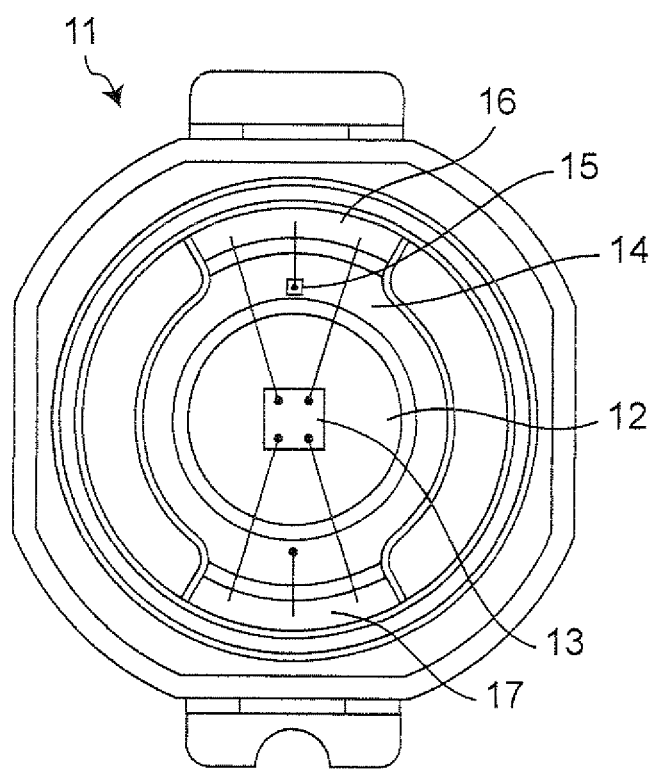
FIG. 15 is a plan view of a conventional light emitting device different from that of FIG. 14.

FIG. 13 illustrates an example in which the light emitting device 21 shown in the first embodiment is used as a back light source of a liquid crystal display. The light source in this case is a single edge light type backlight structured of a plurality of light emitting devices 21 set in a line in a transverse direction along an upper side of a light guide plate 81 inside the screen of the liquid crystal display. The light emitted downward from each of the light emitting devices 21 is guided from the upper end face of the light guide plate 81 to the inside of the light guide plate 81 and is emitted from the surface of light guide plate 81 toward each pixel of the liquid crystal display (not shown) in a vertical direction with respect to the surface of the light guide plate 81.

In this case, the light guide plate 81, which is a plate-like member for transmitting the light emitted from the light source (light emitting device 21) to uniformly irradiate the liquid crystal display, is generally made of acrylic resin with a dot pattern printed on the surface thereof to scatter light.

It goes without saying that not only the light emitting device 21 but also the light emitting devices 41, 51, 71 can be used as the back light source of the liquid crystal display.

In the first embodiment to the third embodiment, metal plates made of copper alloy with a thickness of 0.4 mm are processed to be used as the first lead terminals 29, 61 and the second lead terminals 30, 62.

Further, the first lead terminals 29, 61 and the second lead terminals 30, 62 are silver-plated to have a thickness of 5 micrometer in order to enhance light reflectance in the sidewalls 36, 67 and the extended sidewall 68. Metals used for plating include Cu, Ni, Au, Al, Mg alloys, or alloys of Al and Mg.

In the light emitting devices 21, 41, 51, 71 in the respective embodiments, a wavelength changing member (not shown) for changing the wavelength of the light emitted from the light emitting diode chips 22, 23, 42, 43, 52 to 54 may be filled in the recess sections 32, 69. As the wavelength changing member, silicon resin may be used which contains $(SiAl)_6(O.N)_8$:Eu as a green fluorescent substance and $CaAlSiN_3$:Eu as a red fluorescent substance. Alternatively, light permeable silicon resin same as the resin used as the wavelength changing member may be filled in the cavity 31 of the resin section 25 as the light permeable molding member.

With this configuration, the light emitted from the light emitting diode chips 22, 23, 42, 43, 52 to 54 or from the fluorescent substance is refracted between air and the wavelength changing member near the opening of the cavity 31, so that the light going toward the Zener diodes 24, 44, 55 can be reduced.

However, part of the light may be reflected on the surface of the light permeable silicon resin filled in the cavity 31 due to a refractive index difference between the surface and air layer, and the light trapped in the translucency silicon resin filled in the cavity 31 may turn into the light which goes toward the Zener diodes 24, 44, 55. Therefore, sufficient light loss reduction effect in the Zener diodes 24, 44, 55 is not provided.

Accordingly, the above-stated problems can be solved by sealing only the Zener diodes 24, 44, 55 with the light permeable silicon resin by potting instead of filling the entire cavity 31 with light permeable silicon resin as the light permeable molding member. A light reflecting member may be added to the light permeable silicon resin that seals only the Zener diodes 24, 44, 55.

Polyphthalamide resin is used for the resin section 25. The polyphthalamide resin is white resin having a property to reflect light.

It should be understood that the embodiments disclosed are in all respects illustrative and are not considered as the basis for limitative interpretation. Therefore, the technical scope of this invention should not be interpreted only by the embodiments disclosed but is defined based on the appended claims. All changes which come within the range and meaning of equivalency of the claims are therefore intended to be embraced therein.

REFERENCE SIGNS LIST 21, 41, 51, 71 light emitting device
22, 23, 42, 43, 52-54 light emitting diode chip
24, 44, 55 Zener diode
25 resin section
26-28, 45, 56-59, 60, 73 bonding wire
29, 61 first lead terminal
29a, 61a first terminal section
30, 62 second lead terminal
30a, 62a second terminal section
31 cavity
32, 69 recess section
33 inner lead of the first lead terminal
34 flange of the recess section
35 bottom of the recess section
36 sidewall of the recess section
63 second recess section
64 first recess section
66 bottom of the second recess section
67 sidewall of the second recess section
65 extended bottom of the first recess section
68 extended sidewall of the first recess section
70 flange of the first recess section
72 flange of the second recess section
81 light guide plate

The invention claimed is:

1. A light emitting device comprising:
at least one light emitting element;
a protection element having an electrode;
a first lead terminal including a first end portion and a second end portion and on which the protection element is mounted;
a second lead terminal which is generally flush with the first lead terminal and on which the light emitting element is mounted, the second lead terminal including a first end portion which faces the second end portion of the first lead terminal; and
a resin section covering the first lead terminal and the second lead terminal so as to expose the first end portion of the first lead terminal and the second end portion of the second lead terminal, the resin section having a cavity formed to expose a mounting surface for the protection element of the first lead terminal and a mounting surface for the light emitting element of the second lead terminal,
wherein a recess section is provided on the mounting surface for the light emitting element of the second lead terminal positioned inside the cavity, the light emitting element being mounted on a bottom of the recess section,
wherein the protection element is mounted on the mounting surface for the protection element of the first lead terminal positioned inside the cavity, and
wherein the electrode of the protection element and the second lead terminal are electrically connected through a bonding wire.

2. The light emitting device as claimed in claim 1, wherein the light emitting device has a plurality of light emitting elements, which are arranged in parallel with each other and electrically connected in parallel, and
the electrode of the protection element is electrically connected to the bottom of the recess section in the second lead terminal through a bonding wire.

3. The light emitting device as claimed in claim 2, wherein the recess section formed in the second lead terminal is in a rectangular shape, and
the plurality of light emitting elements are placed such that a long side of each of the light emitting elements is generally in parallel with a shorter side of the rectangular recess section.

4. The light emitting device as claimed in claim 1, wherein the protection element is mounted on a surface of the first lead terminal located at a position higher than the light emitting element which is mounted on the bottom of the recess section of the second lead terminal.

5. The light emitting device as claimed in claim 1, wherein the first lead terminal mounted with the protection element has a smaller area that is exposed to an inside of the cavity formed in the resin section than the second lead terminal.

6. A light emitting device comprising:
a first lead terminal having a mounting surface;
a second lead terminal having a mounting surface and facing the first lead terminal with a distance from the first lead terminal;
a protection element mounted on the mounting surface of the first lead terminal;
at least one light emitting element mounted on the mounting surface of the second lead terminal; and
a resin section having a cavity to expose the mounting surface of the first lead terminal and the mounting surface of the second lead terminal and covering the first lead terminal and the second lead terminal,
wherein, of the first lead terminal and the second lead terminal, at least the second lead terminal has a recess section on the mounting surface positioned inside the cavity,
wherein the at least one light emitting element is mounted on a bottom of the recess section of the second lead terminal, and a wall surface defining the recess section functions as a reflective surface for reflecting light emitted from the light emitting element, and
wherein the protection element is mounted on a mounting surface portion of the first lead terminal positioned inside the cavity, the mounting surface portion being positioned closer to a cavity opening than the bottom of the recess section.

7. The light emitting device as claimed in claim 6, wherein the light emitting device has a plurality of light emitting elements, which are arranged in parallel with each other and electrically connected in parallel, and
the electrode of the protection element is electrically connected to the bottom of the recess section in the second lead terminal through a bonding wire.

8. The light emitting device as claimed in claim 7, wherein the recess section formed in the second lead terminal is in a rectangular shape, and
the plurality of light emitting elements are placed such that a long side of each of the light emitting elements is generally in parallel with a shorter side of the rectangular recess section.

9. The light emitting device as claimed in claim 6, wherein
the protection element is mounted on a surface of the first lead terminal located at a position higher than the light emitting element which is mounted on the bottom of the recess section of the second lead terminal.

10. The light emitting device as claimed in claim 6, wherein
the first lead terminal mounted with the protection element has a smaller area that is exposed to an inside of the cavity formed in the resin section than the second lead terminal.

11. A light emitting device comprising:
at least one light emitting element;
a protection element having an electrode;
a first lead terminal including a first end portion and a second end portion and on which the protection element is mounted;
a second lead terminal which is generally flush with the first lead terminal and on which the light emitting element is mounted, the second lead terminal including a first end portion which faces the second end portion of the first lead terminal; and
a resin section covering the first lead terminal and the second lead terminal so as to expose the first end portion of the first lead terminal and the second end portion of the second lead terminal, the resin section having a cavity formed to expose a mounting surface for the protection element of the first lead terminal and a mounting surface for the light emitting element of the second lead terminal,
wherein the second end portion of the first lead terminal positioned inside the cavity has a first recess section formed to have a rectangular shape with three sides forming wall surfaces and a remaining one side being open at an extremity of the second end portion of the first lead terminal, and the protection element is mounted outside the first recess section,
wherein the first end portion of the second lead terminal positioned inside the cavity has a second recess section in a rectangular shape with three sides forming wall surfaces and a remaining one side being open at an extremity of the first end portion of the second lead terminal, and the light emitting element is mounted on a bottom of the second recess section,
wherein a space between the second end portion of the first lead terminal and the first end portion of the second lead terminal, which face each other, is filled with the resin section, the first recess section and the second recess section forming one recess section together with the resin section, and
wherein the electrode of the protection element and the second lead terminal are electrically connected through a bonding wire.

12. The light emitting device as claimed in claim 11, wherein
the electrode of the protection element is electrically connected to outside of the recess section in the second lead terminal through a bonding wire.

13. The light emitting device as claimed in claim 11, wherein
the protection element is mounted on a surface of the first lead terminal located at a position higher than the light emitting element which is mounted on the bottom of the recess section of the second lead terminal.

14. The light emitting device as claimed in claim 11, wherein
the first lead terminal mounted with the protection element has a smaller area that is exposed to an inside of the cavity formed in the resin section than the second lead terminal.

* * * * *